(12) United States Patent
Isokawa

(10) Patent No.: US 7,098,485 B2
(45) Date of Patent: Aug. 29, 2006

(54) OPTICAL SEMICONDUCTOR UNIT

(75) Inventor: Shinja Isokawa, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 330 days.

(21) Appl. No.: 10/857,200

(22) Filed: May 28, 2004

(65) Prior Publication Data

US 2006/0151809 A1    Jul. 13, 2006

(30) Foreign Application Priority Data

Jun. 3, 2003    (JP)  ............................ 2003-157660

(51) Int. Cl.
*H01L 33/00* (2006.01)
(52) U.S. Cl. ........................................ 257/98; 362/294
(58) Field of Classification Search .................. 257/98, 257/99, 100, 705, 706, 707; 362/226, 240, 362/241, 294, 362
See application file for complete search history.

(56) References Cited

U.S. PATENT DOCUMENTS 6,355,946 B1    3/2002  Ishinaga 6,603,148 B1    8/2003  Sano et al.
7,026,756 B1 *  4/2006  Shimizu et al. ............. 313/503

FOREIGN PATENT DOCUMENTS

JP    11-345912    12/1999
JP    2000-183407   6/2000

* cited by examiner

*Primary Examiner*—Phuc T. Dang
(74) *Attorney, Agent, or Firm*—Hamre, Schumann, Mueller & Larson, P.C.

(57) ABSTRACT

An optical semiconductor device includes an optical semiconductor chip, a light permeable member covering the chip, and a reflector formed with an accommodation space for accommodating the light permeable member. The light permeable member includes a convex lens for converging light emitted from the optical semiconductor chip. The reflector includes a reflecting surface for reflecting light emitted from the optical semiconductor chip. At least part of the convex lens is located within the accommodation space of the reflector. The light permeable member includes an extension engaging and extending along the reflecting surface. The extension includes a light emitting surface surrounding the convex lens.

7 Claims, 8 Drawing Sheets

OPTICAL SEMICONDUCTOR UNIT

BACKGROUND OF THE INVENTION

1. Field of the Invention

The present invention generally relates to an optical semiconductor device utilizing an optical semiconductor chip such as an LED chip.

2. Description of the Related Art

A light emitting diode (LED) has advantages such as small power consumption, small size and long lifetime. Therefore, an optical semiconductor device utilizing an LED chip is widely used as a light source in various fields. Examples of such optical semiconductor device are disclosed in JP-A-11-345912 and JP-A-2000-183407. In these prior art devices, a convex lens or a reflector is provided to enhance the directivity of light or increase the brightness.

FIG. 7 shows an example of optical semiconductor device as a related art. In the illustrated semiconductor device B, an LED chip 102 mounted on a substrate 101 is covered with a light permeable member 103. The light permeable member 103 has an upper portion formed with a convex lens 131. The light permeable member 103 is surrounded by a reflector 104. The reflector 104 has an inclined surface (reflecting surface) 141 for reflecting light.

As shown in FIG. 7, the light emitted from the LED chip 102 partially passes through the convex lens 131 and is partially reflected by the reflecting surface 141 of the reflector 104. The light passed through the convex lens 131 travels as a beam of light which is parallel to the axis of the lens 131. The light reflected by the reflecting surface 141 of the reflector 104 is directed upward.

With such a structure, the light emitted from the LED chip 102 can be directed generally in the same direction, so that the illumination target region can be illuminated properly. However, the optical semiconductor device B has the following problems.

The convex lens 131 of the optical semiconductor device B projects upward beyond the upper surface of the reflector 104. Therefore, the outside dimension of the optical semiconductor device B is larger than an optical semiconductor device which does not include a convex lens.

For example, the optical semiconductor device B is used as a light source of a back light of a liquid crystal display incorporated in a cellular phone. In this case, as shown in FIG. 8, the optical semiconductor device B is disposed to face a side surface of a light guide panel 161 arranged at the back of a liquid crystal panel 160. However, since the dimension of the optical semiconductor device B increases by as much as the projecting amount of the convex lens 131 as noted above, the size of cellular phone cannot be reduced sufficiently. Further, in the optical semiconductor device B, the lens 131 is liable to be damaged in carrying the device or mounting the device to a predetermined portion.

SUMMARY OF THE INVENTION

The present invention has been conceived under the circumstances described above. It is therefore an object of the present invention to provide a compact optical semiconductor device which is capable of properly irradiating a target region with light.

An optical semiconductor device provided according to the present invention comprises an optical semiconductor chip, a light permeable member covering the optical semiconductor chip and including a convex lens for converging light emitted from the optical semiconductor chip, and a reflector including an accommodation space for accommodating the optical semiconductor chip and the light permeable member and a reflecting surface for reflecting light emitted from the optical semiconductor chip. At least part of the convex lens is located within the accommodation space of the reflector. The light permeable member includes an extension engaging and extending along the reflecting surface, and the extension includes a light emitting surface surrounding the convex lens.

Preferably, the convex lens is entirely located within the accommodation space.

Preferably, the light emitting surface is non-parallel to the reflecting surface. Preferably, in this case, the light emitting surface is larger than the reflecting surface in inclination angle relative to a forward direction of the optical semiconductor chip.

The light emitting surface may be parallel to the reflecting surface.

Preferably, both of the reflecting surface and the light emitting surface are inclined to become progressively further from the optical semiconductor chip in a direction perpendicular to a forward direction of the semiconductor chip as the reflecting surface and the light emitting surface extend in the forward direction.

Preferably, the optical semiconductor device further comprises a substrate for mounting the optical semiconductor chip, the light permeable member and the reflector. The substrate is formed with a wiring pattern connected to the optical semiconductor chip.

Other features and advantages of the present invention will become clearer from the description given below with reference to the accompanying drawings.

DETAILED DESCRIPTION OF THE PREFERRED EMBODIMENTS

Preferred embodiments of the present invention will be described below with reference to the accompanying drawings.

Figure 1:
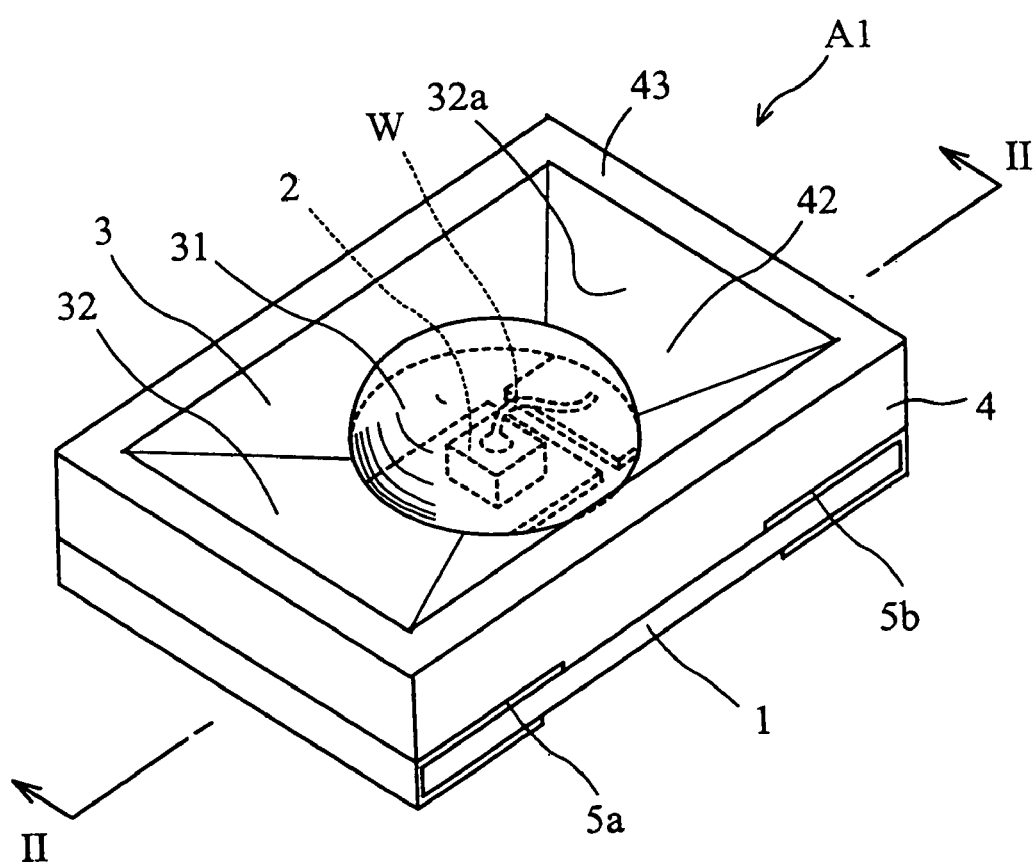
FIG. 1 is a perspective view showing an optical semiconductor device according to a first embodiment of the present invention.
Figure 2:
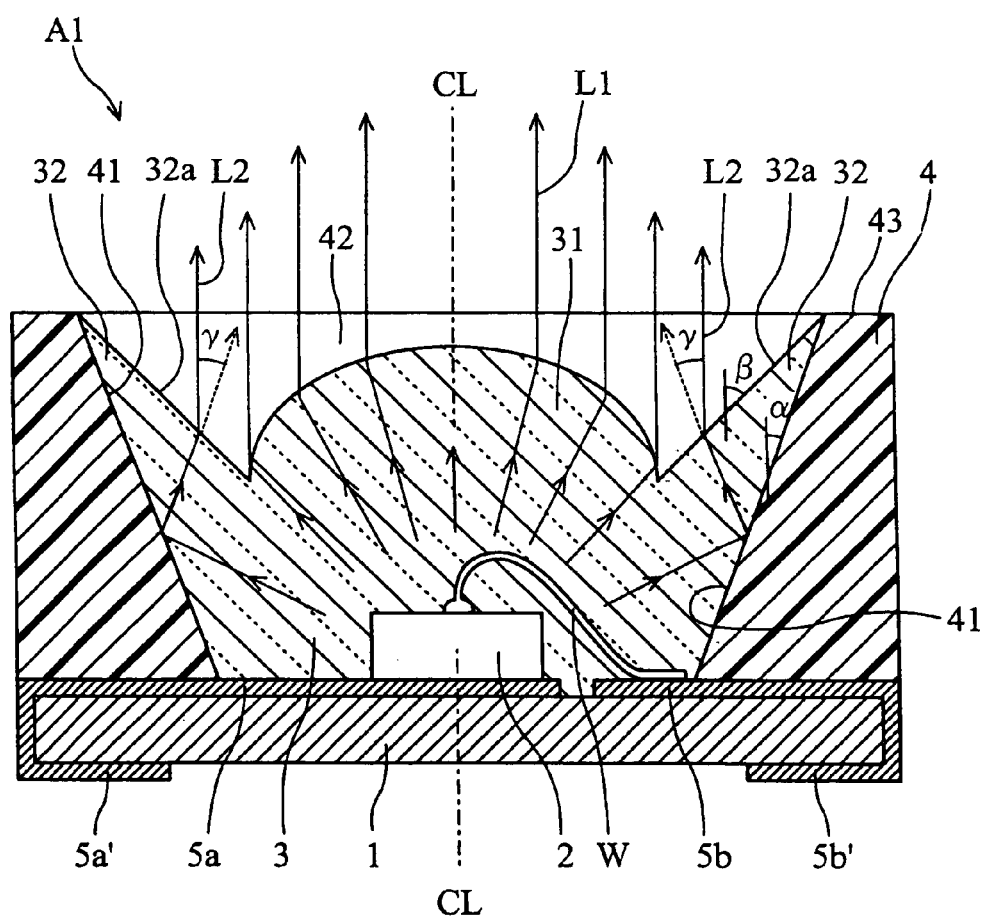
FIG. 2 is a sectional view taken along lines II—II in FIG. 1.

FIGS. 1 and 2 show an optical semiconductor device according to a first embodiment of the present invention. The illustrated optical semiconductor device A1 includes a rectangular insulating substrate 1, an LED chip 2, a light permeable member 3 and a reflector 4.

The substrate 1 is made of a glass-fiber-reinforced epoxy resin, for example. The LED chip 2, the light permeable member 3 and the reflector 4 are mounted on the upper surface of the substrate 1. The LED chip 2 has an upper surface and a lower surface respectively formed with electrodes. The LED chip 2 is bonded to a first conductor portion 5a provided on the substrate 1. By this bonding, the electrode on the lower surface of the chip 2 is electrically connected to the first conductor portion 5a. The electrode on the upper surface of the chip 2 is electrically connected, via a wire W, to a second conductor portion 5b provided on the substrate 1. The first and the second conductor portions 5a, 5b extend from the upper surface up to the lower surface of the substrate 1 and include terminals 5a' and 5b', respectively.

The reflector 4 is in the form of a rectangular frame having an accommodation space 42 for accommodating the LED chip 2 and the light permeable member 3. The reflector 4 has a plurality of flat inner wall surfaces (reflecting surfaces) 41 for reflecting light. The accommodation space 42 is defined by the reflecting surfaces 41. As will be understood from FIG. 2, the width of the accommodation space 42 increases as the accommodation space extends upward. The reflector 4 may be made of white-based resin prepared by adding titanium oxide to polycarbonate, for example. Therefore, each of the reflecting surfaces 41 comprises a white surface having a high reflectivity. Each of the reflecting surfaces 41 is inclined at an appropriate angle $\alpha$ to the vertical for reflecting the light traveling from the LED chip 2 upward (toward the front side of the apparatus A1). The reflector 4 may be made of liquid crystal polymer or polyamide-based resin, instead of the above-noted material.

The light permeable member 3 is made of e.g. a transparent epoxy resin and arranged in the accommodation space 42 of the reflector 4 to cover the LED chip 2. The light permeable member 3 includes a convex lens 31 and an extension 32 integrally connected to the convex lens. As will be understood from FIG. 2, the convex lens 31 is located directly above the LED chip 2. The configuration of the convex lens 31 is symmetrical with respect to an imaginary center line CL. The center line CL is perpendicular to the upper and the lower surfaces of the chip 2 and the upper and the lower surfaces of the substrate 1. The convex lens 31 comprises part of the light permeable member 3 which is bulged to have a spherical or aspheric curved surface and functions to converge light emitted from the LED chip 2. The convex lens 31 is entirely located within the accommodation space 42 of the reflector 4 so as not to project upward beyond an upper surface 43 of the reflector 4.

The extension 32 surrounds the convex lens 31 and extends obliquely upward from the base portion of the convex lens 31 along the reflecting surfaces 41 of the reflector 4. The extension 32 has an upper end which is at the same height as the upper surface 43 of the reflector 4 and does not project out of the reflector 4. The extension 32 has a plurality of surfaces (light emitting surfaces) 32a exposed toward the inner side (toward the center line CL) of the optical semiconductor device A1. Each of the light emitting surfaces 32a is flat and its "sign of inclination" ("+" or "−") is the same as that of the adjacent reflecting surface 41 of the reflector 4. However, the inclination angle $\beta$ of the light emitting surface 32a (absolute value) is larger than the inclination angle $\alpha$ of the reflecting surface 41. Therefore, the light emitting surface 32a is non-parallel to the reflecting surface 41, and the thickness of the extension 32 gradually decreases as the extension extends upward. It is to be noted that, the above inclination angles $\alpha$, $\beta$ are inclination angles with respect to the center line CL (or an imaginary line which is parallel to the center line). In this specification, such an inclination angle is referred to also as "an inclination angle relative to the forward direction of the optical semiconductor chip". The respective inclination angles $\beta$ of the plurality of light emitting surfaces 32a need not be equal but may differ from each other. Similarly, the respective inclination angles $\alpha$ of the plurality of reflecting surfaces 41 may differ from each other.

Figure 3:
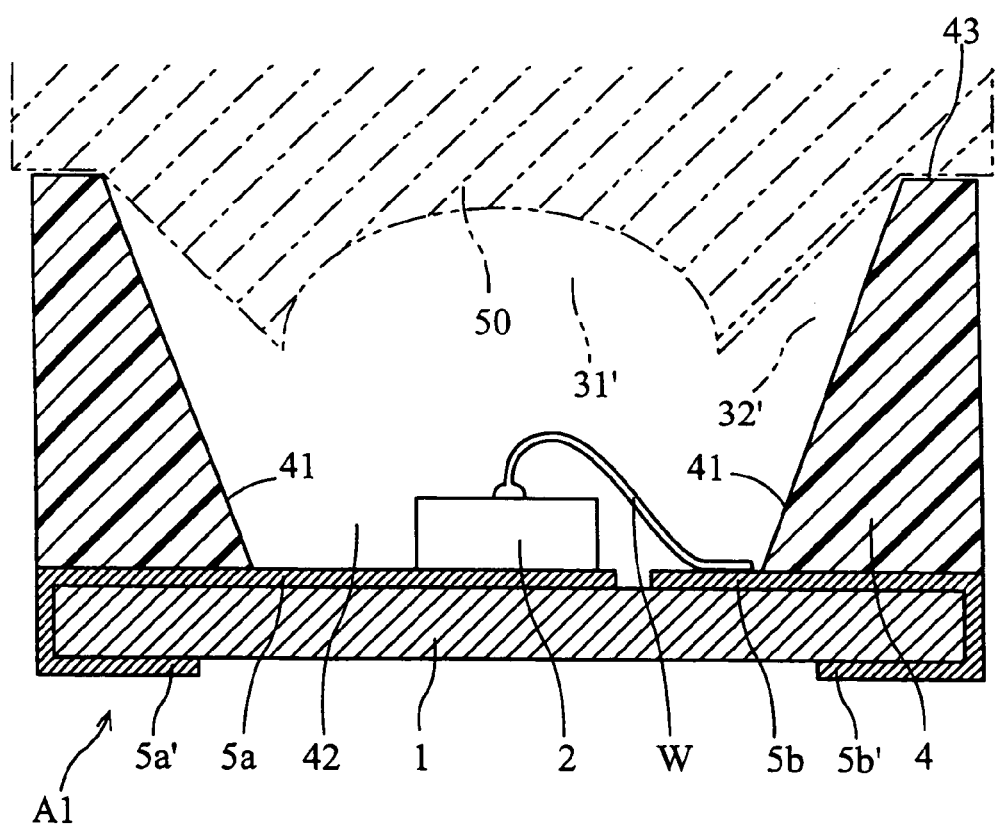
FIG. 3 is a sectional view showing a process step of a method for manufacturing the optical semiconductor device.

The light permeable member 3 may be formed by using a mold 50 as shown in FIG. 3. The mold 50 includes a recess 31' for forming the convex lens 31 and a recess 32' for forming the extension 32. Specifically, a lower portion of the mold 50 is inserted into the accommodation space 42 of the reflector 4 (See the single dashed line in FIG. 3). As a result, a space corresponding to the configuration of the light permeable member 3 (the space surrounded by the mold 50, the reflector 43 and the substrate 1) is defined. Subsequently, transparent resin is loaded into the space. By hardening the loaded resin thereafter, the intended light permeable member 3 is obtained.

Next, the operation and advantages of the optical semiconductor device A1 will be described.

As shown in FIG. 2, part of the light emitted from the LED chip 2 travels as a beam of light which is generally parallel to the vertical axis (center line CL) by the converging effect of the convex lens 31 (See the reference sign L1). On the other hand, all other light reaches the reflecting surfaces 41 and reflected upward by the reflecting surfaces 41. The reflected light (more precisely, part of the reflected light) passes through the light emitting surfaces 32a of the extension 32 for emission to the outside (See the reference sign L2). When the light passes through the light emitting surfaces 32a, the light is refracted at a predetermined angle $\gamma$. Specifically, the light is so refracted that the inclination angle of the light L2 with respect to the vertical axis reduces. In this way, in the optical semiconductor device A1, the light passing through the light emitting surface 32a of the extension 32 for emission to the outside can also be caused to travel generally in parallel to the vertical axis similarly to the light L1 passing through the convex lens 31.

The inclination angle $\beta$ of the light emitting surfaces 32a is set larger than the inclination angle $\alpha$ of the reflecting surfaces 41. Therefore, the area of the light emitting surfaces 32a is relatively large. Accordingly, the amount of light which passes through the light emitting surfaces 32a for refraction is increased, whereby the amount of light which travels generally in parallel to the vertical axis can be increased. Thus, in the optical semiconductor device A1, the directivity of light can be enhanced, whereby the region on the front side of the device can be efficiently irradiated with light.

Figure 8:
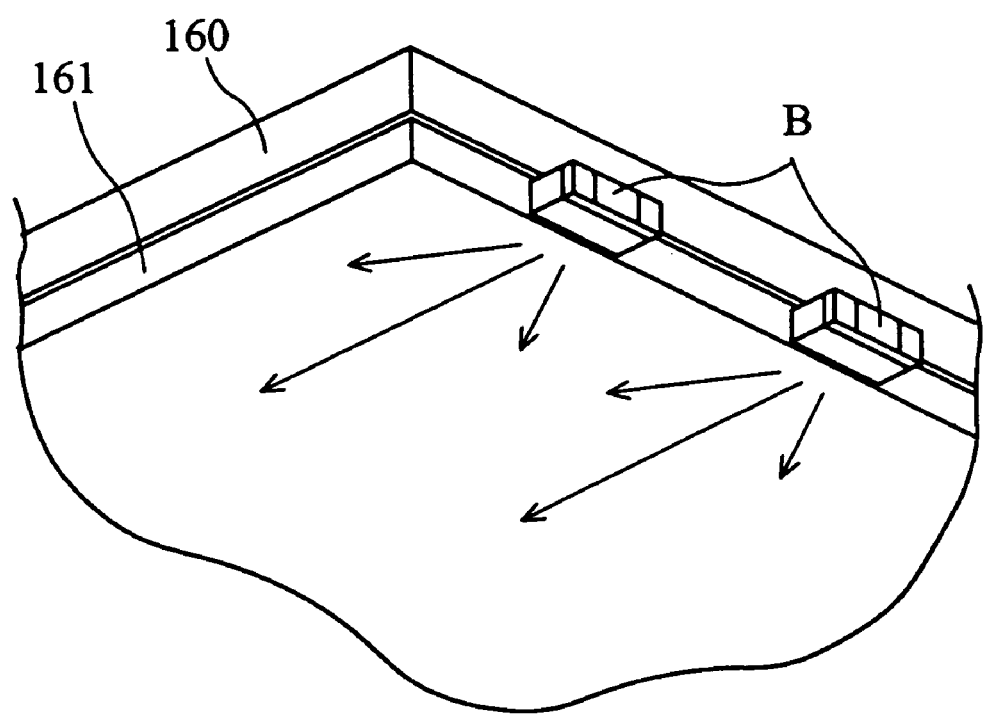
FIG. 8 shows an example of usage of the optical semiconductor device of FIG. 7.

The convex lens 31 is entirely located within the accommodation space 42 of the reflector 4. Therefore, the height of the optical semiconductor device A1 can be made generally equal to a device which is not provided with a convex lens 31. Therefore, the optical semiconductor device A1 can be suitably used as a structural part of an apparatus the size reduction of which is strongly demanded, e.g. as a light source of a back light of a liquid crystal display in a cellular phone, as described with reference to FIG. 8. Since the convex lens 31 does not project from the reflector 4, the convex lens 31 is unlikely to come into contact with other parts, whereby damage to the convex lens 31 can be reduced.

Figure 7:
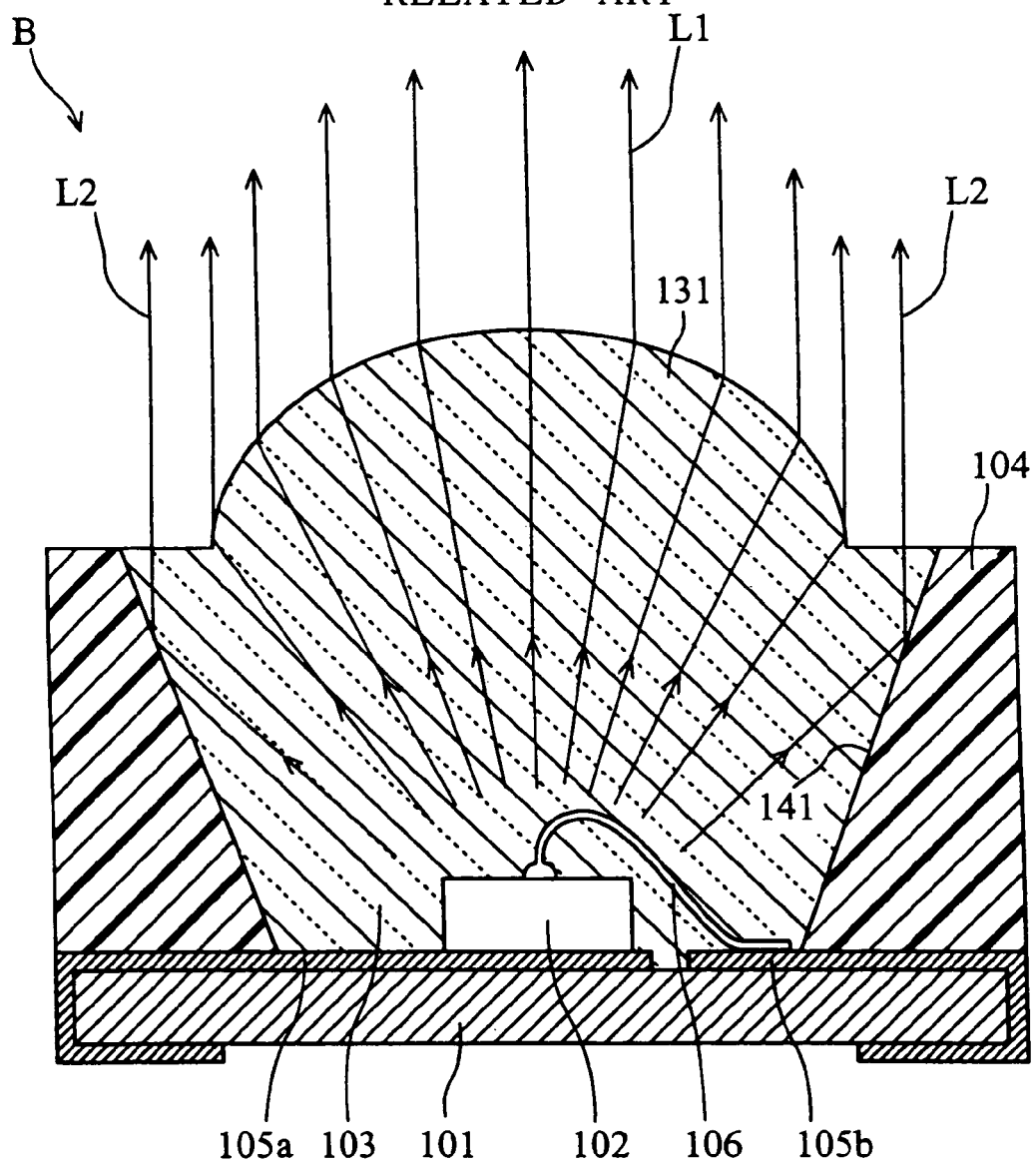
FIG. 7 is a sectional view showing an optical semiconductor device as a related art of the present invention.

As noted above, it is preferable that the convex lens 31 is entirely accommodated in the accommodation space 42 of the reflector 4. However, the front end (upper portion) of the convex lens 31 may project upward beyond the upper end 43 of the reflector 4, while the base portion (lower portion) of the convex lens is located within the accommodation space. Even with such an arrangement, the size of the entire optical semiconductor device can be made smaller than the structure (FIG. 7) in which the entirety of the convex lens projects outward from the reflector.

Although a single optical semiconductor chip is mounted on the substrate in the structure shown in FIG. 1, a plurality of optical semiconductor chips may be mounted. The optical semiconductor chips may emit light of the same color or may emit different colors of light. The optical semiconductor chip is not limited to an LED chip. The optical semiconductor device may be so designed as to emit e.g. infrared rays instead of visible light.

Figure 4:
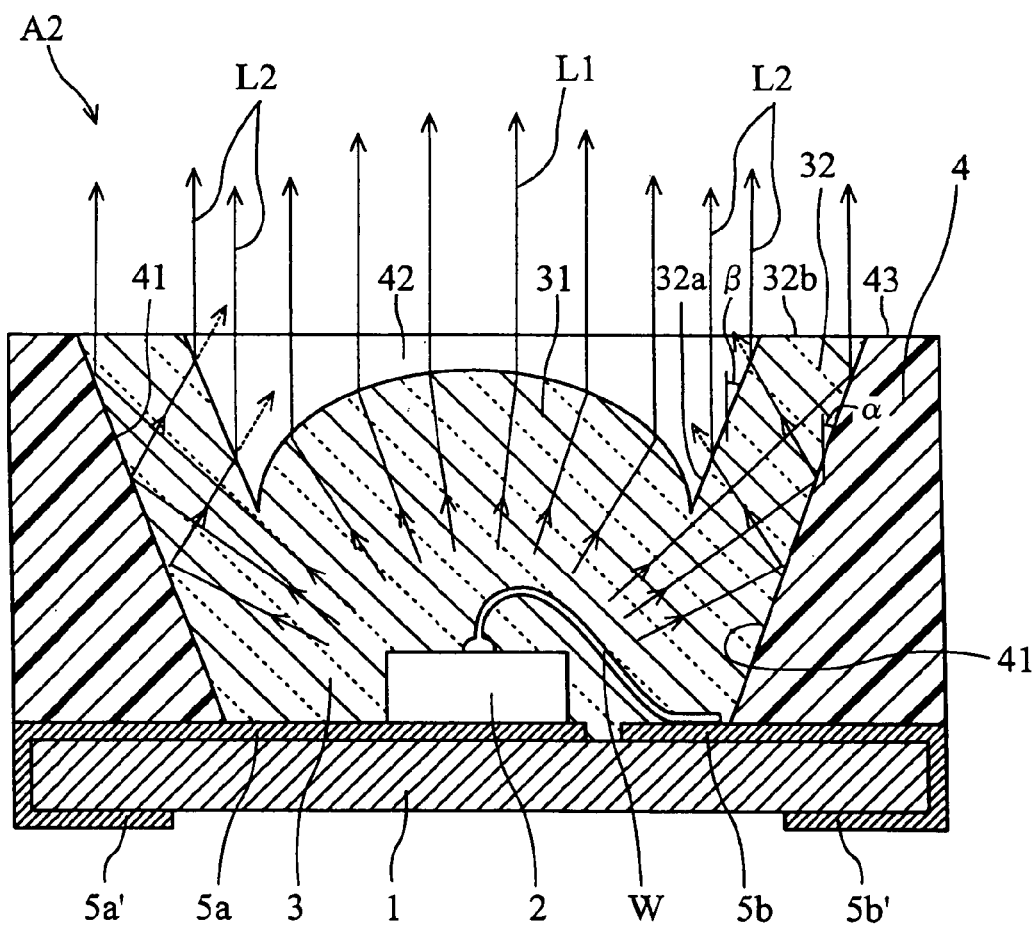
FIG. 4 is a sectional view showing an optical semiconductor device according to a second embodiment of the present invention.
Figure 5:
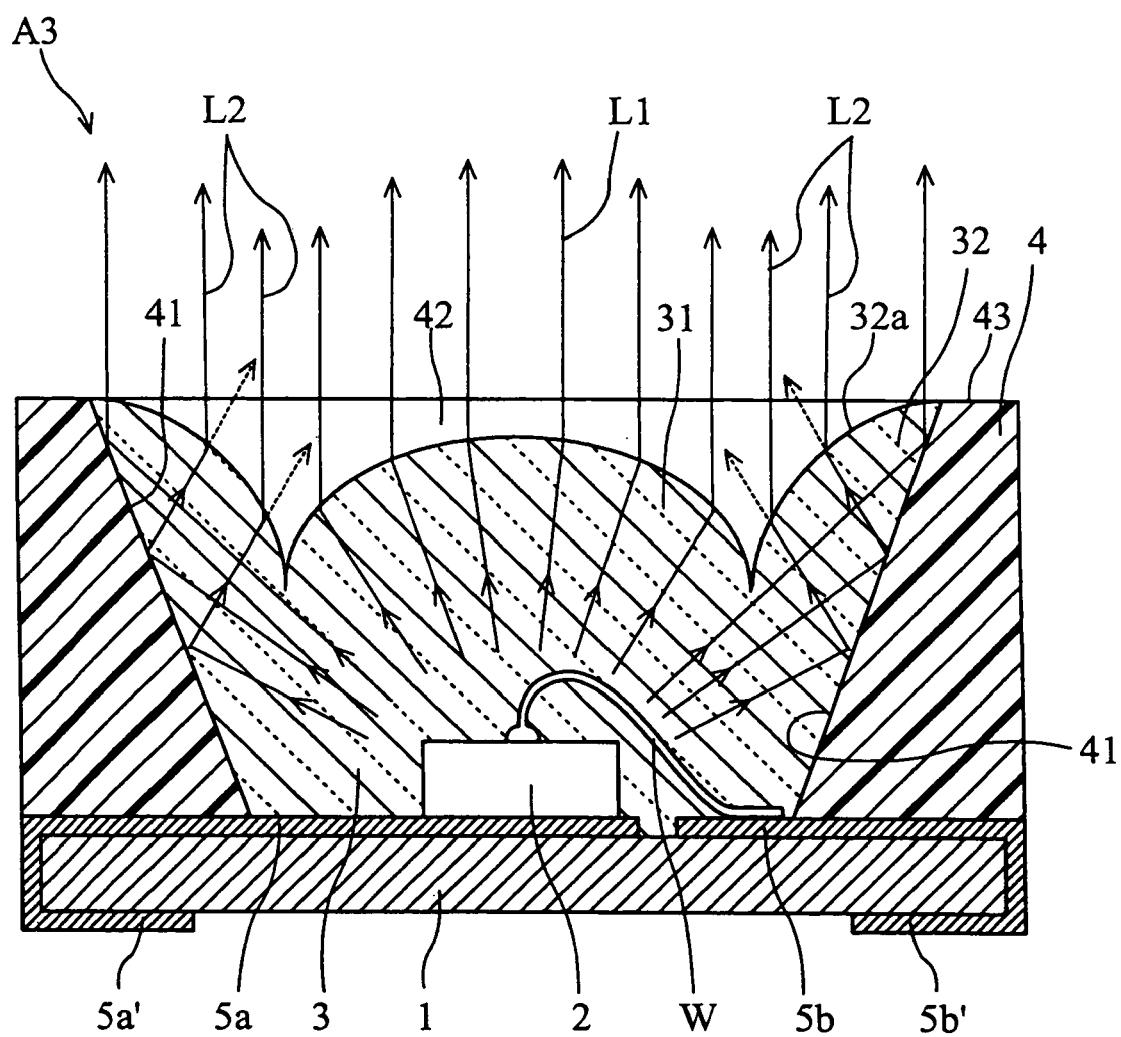
FIG. 5 is a sectional view showing an optical semiconductor device according to a third embodiment of the present invention.
Figure 6:
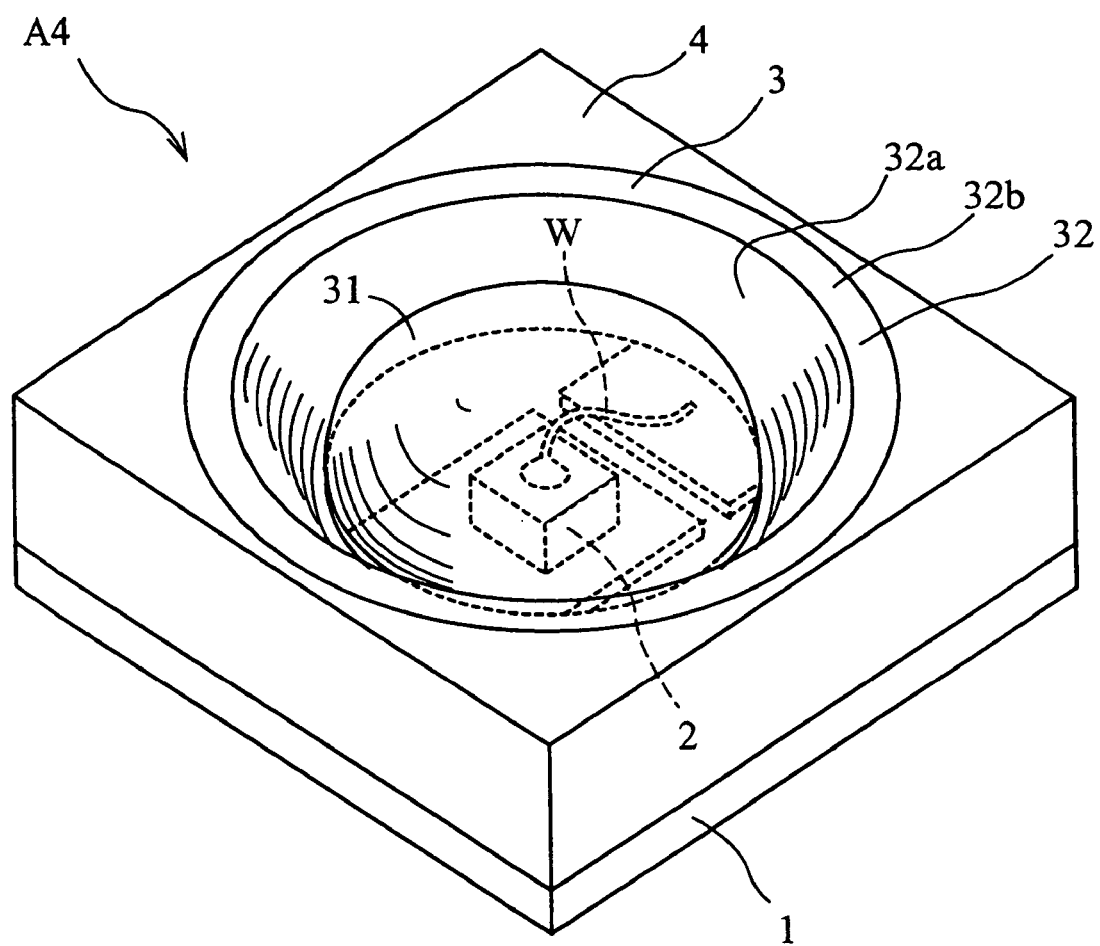
FIG. 6 is a perspective view showing an optical semiconductor device according to a fourth embodiment of the present invention.

FIGS. 4–6 illustrate other examples of optical semiconductor device according to the present invention. In these figures, the elements which are identical or similar to those of the first embodiment are designated by the same reference signs as those used for the first embodiment.

FIG. 4 shows the basic structure of an optical semiconductor device A2 according to a second embodiment of the present invention. In the optical semiconductor device A2, the extension 32 of the light permeable member 3 has a front end surface (upper surface) 32b which is flush with the upper surface 43 of the reflector 4. The inclination angle β of the light emitting surface 32a of the extension 32 is equal (or generally equal) to the inclination angle α of the reflecting surface 41. Therefore, the light emitting surface 32a is parallel to the reflecting surface 41. With such a structure again, the light reflected by the reflecting surface 41 can be emitted to the outside while undergoing refraction at the light emitting surface 32a. While the light traveling generally vertically from the downside can pass through the front end surface 32b to the upside, the light impinging on the front end surface at an incidence angle which is larger than a predetermined total reflection critical angle is totally reflected by the front end surface. Therefore, a large portion of light passing through the front end surface 32b travels generally in parallel to the vertical axis, whereby the directivity of light can be enhanced.

Although it is preferable that the inclination angle β is made relatively large to increase the area of the light emitting surface 32a, the present invention is not limited thereto. The light emitting surface 32a can be made uninclined (β=0) without loosing the light refracting effect the present invention intends.

FIG. 5 shows an optical semiconductor device A3 according to a third embodiment of the present invention. In the optical semiconductor device A3, the light emitting surface 32a of the extension 32 is convexly curved. With the curved light emitting surface 32a, the proportion of light traveling from the reflecting surface 41 and totally reflected by the light emitting surface 32a can be made smaller than when the light emitting surface is flat. Thus, the amount of light emitted through the light emitting surface 32a can be increased.

FIG. 6 shows an optical semiconductor device A4 according to a fourth embodiment of the present invention. In the optical semiconductor device A4, the extension 32 has an annular front end surface (upper surface) 32b. Accordingly, the light emitting surface 32a comprises a curved surface extending from the inner circumference of the front end surface 32b downward toward the periphery of the lens 31. Since the light emitting surface 32a comprises a single curved surface, the configuration of the extension 32 is simplified, which facilitates the molding.

The present invention being thus described, it is apparent that the same may be varied in many ways. Such variations should not be regarded as a departure from the spirit and scope of the present invention, and all such modifications as would be obvious to those skilled in the art are intended to be included within the scope of the following claims.

The invention claimed is:

1. An optical semiconductor device comprising:
    an optical semiconductor chip;
    a light permeable member covering the optical semiconductor chip, the light permeable member including a convex lens for converging light emitted from the optical semiconductor chip; and
    a reflector including an accommodation space for accommodating the optical semiconductor chip and the light permeable member, and a reflecting surface for reflecting light emitted from the optical semiconductor chip;
    wherein at least part of the convex lens is located within the accommodation space of the reflector; and
    wherein the light permeable member includes an extension engaging and extending along the reflecting surface, the extension including a light emitting surface surrounding the convex lens.

2. The optical semiconductor device according to claim 1, wherein the convex lens is entirely located within the accommodation space.

3. The optical semiconductor device according to claim 1, wherein the light emitting surface is non-parallel to the reflecting surface.

4. The optical semiconductor device according to claim 3, wherein the light emitting surface is larger than the reflecting surface in inclination angle relative to a forward direction of the optical semiconductor chip.

5. The optical semiconductor device according to claim 1, wherein the light emitting surface is parallel to the reflecting surface.

6. The optical semiconductor device according to claim 1, wherein both of the reflecting surface and the light emitting surface are inclined to become progressively further from the optical semiconductor chip in a direction perpendicular to a forward direction of the semiconductor chip as the reflecting surface and the light emitting surface extend in the forward direction.

7. The optical semiconductor device according to claim 1, further comprising a substrate for mounting the optical semiconductor chip, the light permeable member and the reflector, wherein the substrate is formed with a wiring pattern connected to the optical semiconductor chip.

* * * * *